(12) United States Patent
Kim

(10) Patent No.: US 9,555,449 B2
(45) Date of Patent: Jan. 31, 2017

(54) FLUX CLEANING METHOD

(71) Applicant: SAMSUNG ELECTRONICS CO., LTD., Suwon-si, Gyeonggi-do (KR)

(72) Inventor: Jong-Guw Kim, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/726,174

(22) Filed: May 29, 2015

(65) Prior Publication Data
US 2015/0258579 A1   Sep. 17, 2015

Related U.S. Application Data

(62) Division of application No. 13/176,071, filed on Jul. 5, 2011, now abandoned.

(30) Foreign Application Priority Data

Jul. 6, 2010 (KR) ........................ 10-2010-0064875

(51) Int. Cl.
B08B 3/02 (2006.01)
B23K 1/00 (2006.01)
(Continued)

(52) U.S. Cl.
CPC .............. B08B 3/02 (2013.01); B23K 1/0016 (2013.01); B23K 1/203 (2013.01); H01L 21/67051 (2013.01); H05K 3/3489 (2013.01)

(58) Field of Classification Search
CPC ......... B08B 3/02; B23K 1/0016; B23K 1/203; H01L 21/4864; H01L 21/67051; H05K 3/3489
(Continued)

(56) References Cited

U.S. PATENT DOCUMENTS 5,445,699 A   8/1995 Kamikawa et al.
5,468,928 A   11/1995 Yelvington
(Continued)

FOREIGN PATENT DOCUMENTS

JP   10-046380   2/1998
JP   3860139 B2   12/2006
(Continued)

OTHER PUBLICATIONS

Amano, et al., JP 10-046380 A—English Machine Translation, Feb. 1998, PAJ.
(Continued)

Primary Examiner — Michael Barr
Assistant Examiner — Levon J Shahinian
(74) Attorney, Agent, or Firm — Lee & Morse, P.C.

(57) ABSTRACT

A flux cleaning apparatus for cleaning an object with flux by removing impurities that include flux from the object with flux includes a body, a mount, at least one steam spraying nozzle, and a steam supplying unit. The mount is coupled with the body for mounting the object with flux. The at least one steam spraying nozzle is coupled with the body for spraying steam toward the object with flux on the mount such that the object with flux is cleaned by the steam sprayed from the steam spraying nozzle. The steam supplying unit is coupled with the body and the steam supplying unit supplies steam to the at least one steam spraying nozzle.

7 Claims, 9 Drawing Sheets

(51) Int. Cl.
*B23K 1/20* (2006.01)
*H01L 21/67* (2006.01)
*H05K 3/34* (2006.01)

(58) Field of Classification Search
USPC .................................. 134/30, 37, 99.1, 198
See application file for complete search history.

(56) References Cited

U.S. PATENT DOCUMENTS

| | | | |
|---|---|---|---|
| 5,709,587 A * | 1/1998 | Shaffer | B24B 1/00 451/38 |
| 5,882,938 A | 3/1999 | Takahashi et al. | |
| 5,964,952 A * | 10/1999 | Kunze-Concewitz | B08B 3/00 134/103.2 |
| 2005/0101393 A1* | 5/2005 | Starr | A63J 5/023 472/65 |
| 2006/0237032 A1* | 10/2006 | Cheng | B08B 3/00 134/2 |
| 2008/0105653 A1* | 5/2008 | Seah | H01L 21/67028 216/92 |
| 2009/0056761 A1 | 3/2009 | Au et al. | |
| 2009/0139541 A1 | 6/2009 | Ozawa et al. | |

FOREIGN PATENT DOCUMENTS

| | | |
|---|---|---|
| JP | 2008-112960 A | 5/2008 |
| KR | 10-0170391 A1 | 3/1999 |
| KR | 10-0264808 B1 | 6/2000 |
| KR | 10-2005-0107196 A | 11/2005 |
| KR | 10-0794495 B1 | 1/2008 |

OTHER PUBLICATIONS

Lee, et al, JP 2008-112960 A—English Maching Translation, May 2008, PAJ.
Korean Office Action dated May 23, 2016 in Corresponding Korean Patent Application No. 10-2010-0064875.

* cited by examiner

FLUX CLEANING METHOD

CROSS-REFERENCE TO RELATED APPLICATIONS

This is a divisional application based on pending application Ser. No. 13/176,071, filed Jul. 5, 2011, the entire contents of which is hereby incorporated by reference.

Korean Patent Application No. 10-2010-0064875, filed on Jul. 6, 2010, in the Korean Intellectual Property Office, and entitled: "Flux Cleaning Apparatus," is incorporated by reference herein in its entirety.

BACKGROUND

When a wire or a solder ball is bonded in a semiconductor fabrication process, a flux application process may be used. The flux application may include applying flux to a pad of a substrate to, e.g., improve adhesiveness of the bonding material being used.

SUMMARY

Embodiments may be realized by providing a flux cleaning apparatus for cleaning an object with flux by removing impurities that include flux from the object with flux. The apparatus includes a body, a mount coupled with the body for mounting the object with flux, at least one steam spraying nozzle coupled with the body for spraying steam toward the object with flux on the mount such that the object with flux is cleaned by the steam sprayed from the steam spraying nozzle, and a steam supplying unit coupled with the body such that the steam supplying unit supplies steam to the at least one steam spraying nozzle.

The apparatus may include a nozzle rotation shaft having the at least one steam spraying nozzle thereon such that a spraying angle of the steam spraying nozzle is adjustable. The apparatus may include a rotation knob on an end of the nozzle rotation shaft such that the nozzle rotation shaft is movable by a user via the rotation knob. The apparatus may include a motor that rotates the nozzle rotation shaft according to a control signal generated from a control unit based on a command input via a command input unit, the motor being coupled with the nozzle rotation shaft.

The apparatus may include a reciprocator that moves the at least one steam spraying nozzle in back and forth directions along a surface of the object with flux. The reciprocator may include a movable base, the at least one steam spraying nozzle being connected to the movable base, a guidance member that guides a path in which the movable base is movable, an actuator in the body, the actuator being configured to move the movable base in the back and forth directions, and a control unit, the control unit being configured to apply a control signal to the actuator based on a command input by a command input unit.

The apparatus may include a clamp that fixes the object with flux by holding side surfaces of the object with flux, the clamp being coupled with the mount. The apparatus may include a cleaning chamber in the body, the cleaning chamber having an internal space for housing the mount and the steam spraying nozzle. The apparatus may include a cap with a handle on top of the cleaning chamber, the cap being removable from the cleaning chamber for inserting and removing the object with flux from the cleaning chamber. The apparatus may include a transparent window in a sidewall of the cleaning chamber such that an interior of the cleaning chamber is observable by a user.

The apparatus may include an exhausting unit connected to the cleaning chamber such that steam sprayed by the steam spraying nozzle is discharged to an outside of the body via the exhausting unit. The exhausting unit may be an exhausting pipe that forcefully discharges steam via an exhausting hole in a side surface of the cleaning chamber. The apparatus may include a discharging tray coupled with the body, the discharging tray collecting impurities removed from the object with flux. The discharging tray may be a drawer-type tray under the cleaning chamber, and the discharging tray may include a handle on a side thereof such that impurities collected by the discharging tray are dischargable.

Embodiments may also be realized by providing a flux cleaning apparatus including an object with flux being cleaned by the flux cleaning apparatus by removing impurities that include flux from the object with flux. The system includes a flux tool, the flux tool being the object with flux being cleaned by the flux cleaning apparatus, and the flux cleaning apparatus. The flux tool includes a flux tool body that includes a flow space therein, a back plate within the flow space of the flux tool body, a flux pin, the flux pin include a first tip on the back plate and a second tip outside the flux tool body, the second tip extending through a pin hole in the flux tool body, and an elastic spring, the elastic spring being between the back plate and the flux tool body such that a recovery force is exerted in a direction in which the flux pin is movable. The flux cleaning apparatus includes a body, a mount coupled with the body for mounting the flux tool, at least one steam spraying nozzle coupled with the body for spraying steam toward the flux tool on the mount such that the flux tool is cleaned by the steam sprayed from the steam spraying nozzle, and a steam supplying unit coupled with the body, the steam supplying unit supplying steam to the at least one steam spraying nozzle.

The system may include a positive pressure forming unit that produces a positive pressure in the flow space of the flux tool body to protect the flux tool body from the steam sprayed from the at least one steam spraying nozzle. The positive pressure forming unit may be a positive pressure forming gas supplying pipe that supplies a positive pressure forming gas to an inlet in the flux tool body.

The system may include an air curtain forming unit that provides an air curtain between the flux pin and the flux tool body to protect the flux tool body from the steam sprayed from the at least one steam spraying nozzle. The air curtain forming unit may be an air spraying nozzle on the body, the air spraying nozzle being configured to spray air to a space between the flux pin and the flux tool body.

Embodiments may also be realized by providing a method of cleaning an object with flux. The method includes providing a flux cleaning apparatus that includes a body, mounting the object with flux to a mount in the body of the flux cleaning apparatus, supplying steam to at least one steam spraying nozzle from a steam supplying unit in the body of the flux cleaning apparatus, and spraying steam from the at least one steam spraying nozzle in the body of the flux cleaning apparatus, the steam being sprayed toward the object with flux on the mount such that the object with flux is cleaned by the steam sprayed from the steam spraying nozzle. The cleaning of the object with flux includes removing impurities that include flux from the object with flux.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
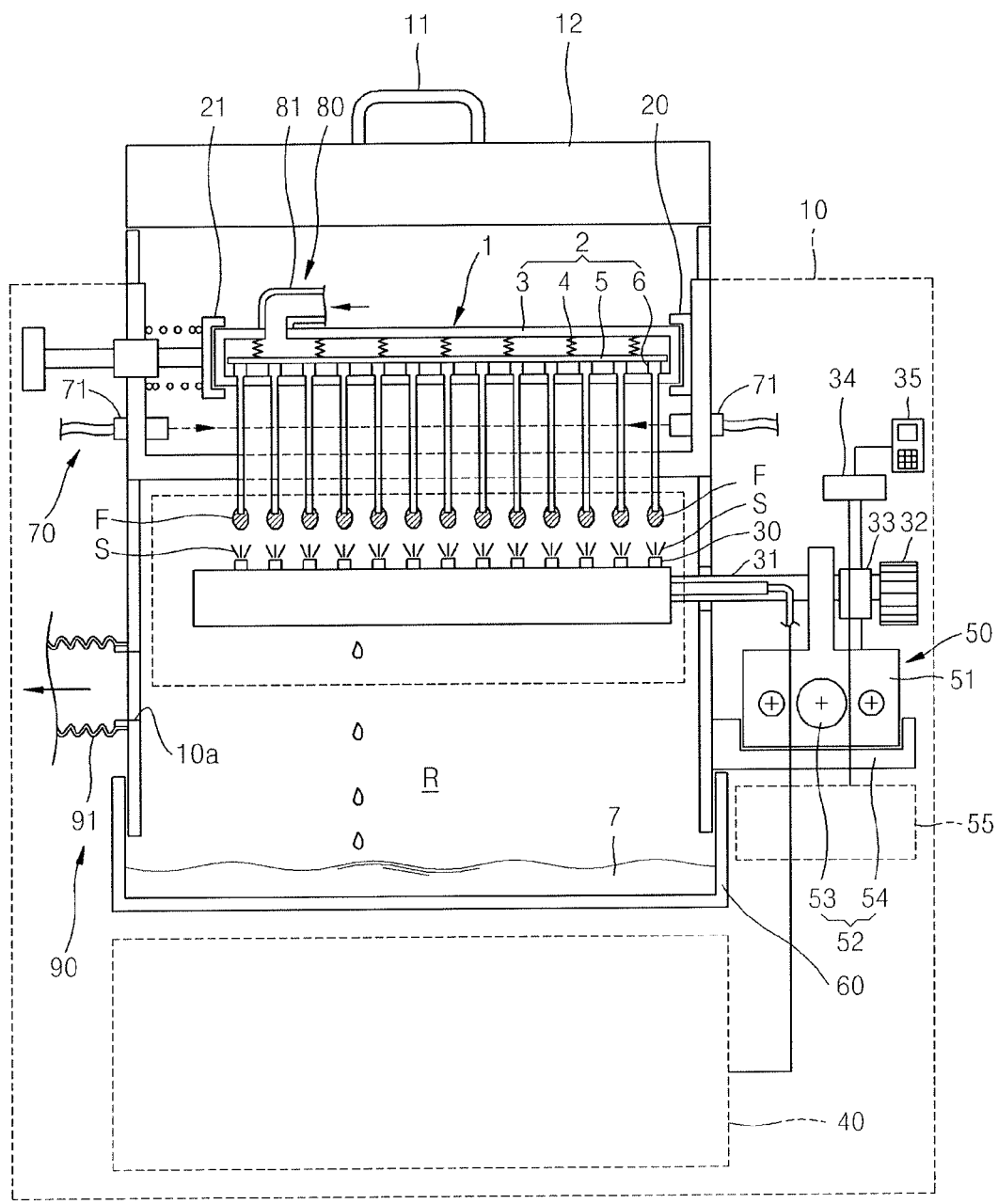
FIG. 1 illustrates a diagram of a flux cleaning apparatus, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. It will be understood by those skilled in the art that various changes in form and details may be made therein without departing from the spirit and scope of the inventive concept.

In the drawing figures, the dimensions of elements may be exaggerated for clarity of illustration. It will also be understood that when an element is referred to as being "on" another element, it can be directly on the other element, or intervening elements may also be present. Further, it will be understood that when an element is referred to as being "under" an element, it can be directly under the other element, or intervening elements may also be present. In addition, it will also be understood that when an element is referred to as being "between" two elements, it can be the only element between the two elements, or one or more intervening elements may also be present. Like reference numerals refer to like elements throughout.

Figure 2:
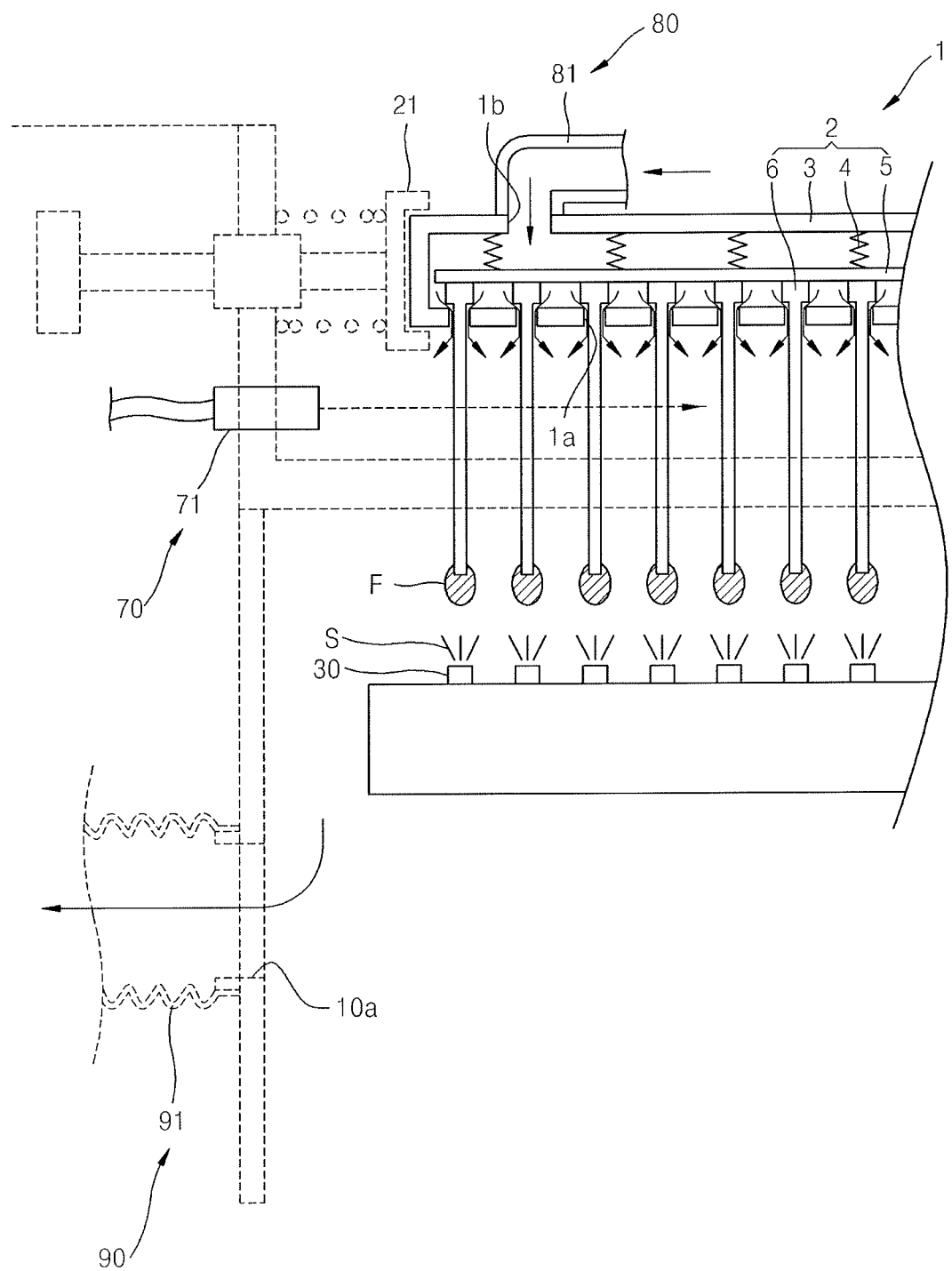
FIG. 2 illustrates in closer detail a diagram of a cleaning status of a flux tool by using the flux cleaning apparatus of FIG. 1.

FIG. 1 illustrates a diagram of a flux cleaning apparatus according to an exemplary embodiment. FIG. 2 illustrates a diagram, in closer detail, of a cleaning status of a flux tool 2 by using the flux cleaning apparatus of FIG. 1.

Referring to FIGS. 1 and 2, the flux cleaning apparatus, according to an exemplary embodiment, may include a body 10, a mount 20, a steam spraying nozzle 30, a steam supplying unit 40, a reciprocator 50, a discharging tray 60, an air curtain forming unit 70, a positive pressure forming unit 80, and an exhausting unit 90. However, embodiments are not limited thereto, e.g., various combinations that include or exclude ones of the above components and units may be used in a flux cleaning apparatus The body 10 may form the outer appearance of the flux cleaning apparatus. The body 10 may support and/or house therein various components including, e.g., the body 10 may support at least one of the mount 20, the steam spraying nozzle 30, the steam supplying unit 40, the reciprocator 50, the discharging tray 60, the air curtain forming unit 70, the positive pressure forming unit 80, and the exhausting unit 90. A cleaning chamber R may be formed inside the body 10 to, e.g., house the mount 20 and the steam spraying nozzle 30.

Figure 3:
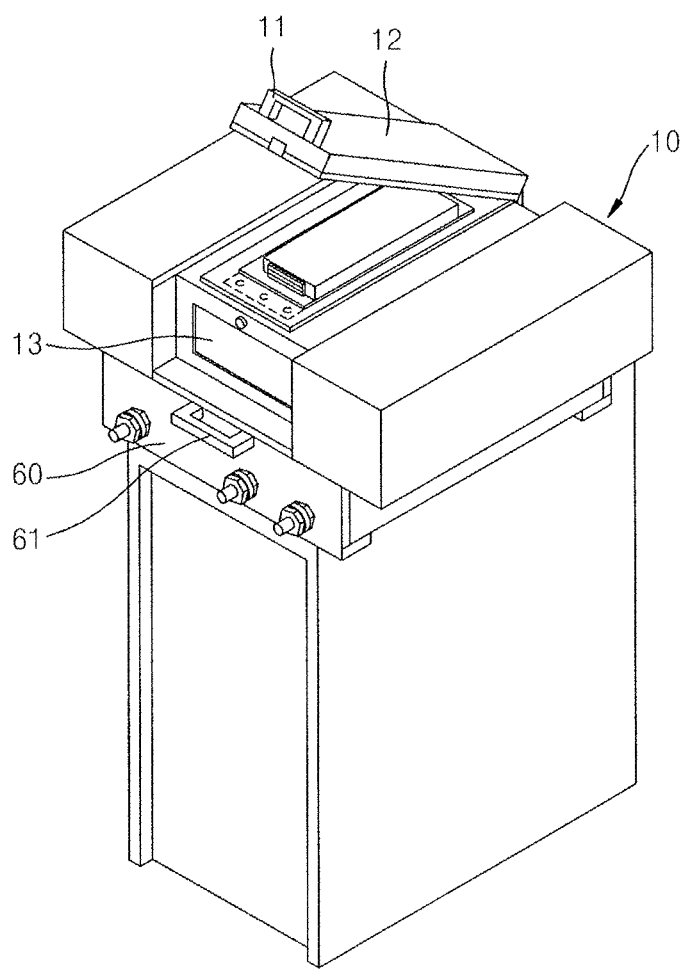
FIG. 3 illustrates a front perspective view of a flux cleaning apparatus, according to an exemplary embodiment.
Figure 4:
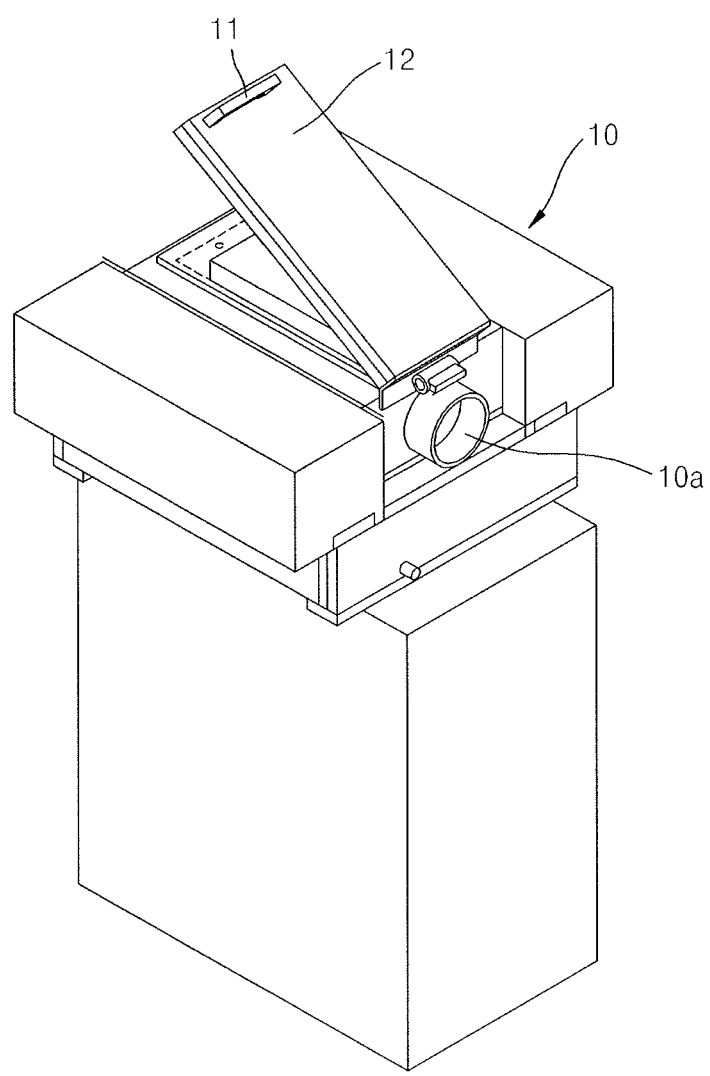
FIG. 4 illustrates a rear perspective view of the flux cleaning apparatus of FIG. 3.
Figure 5:
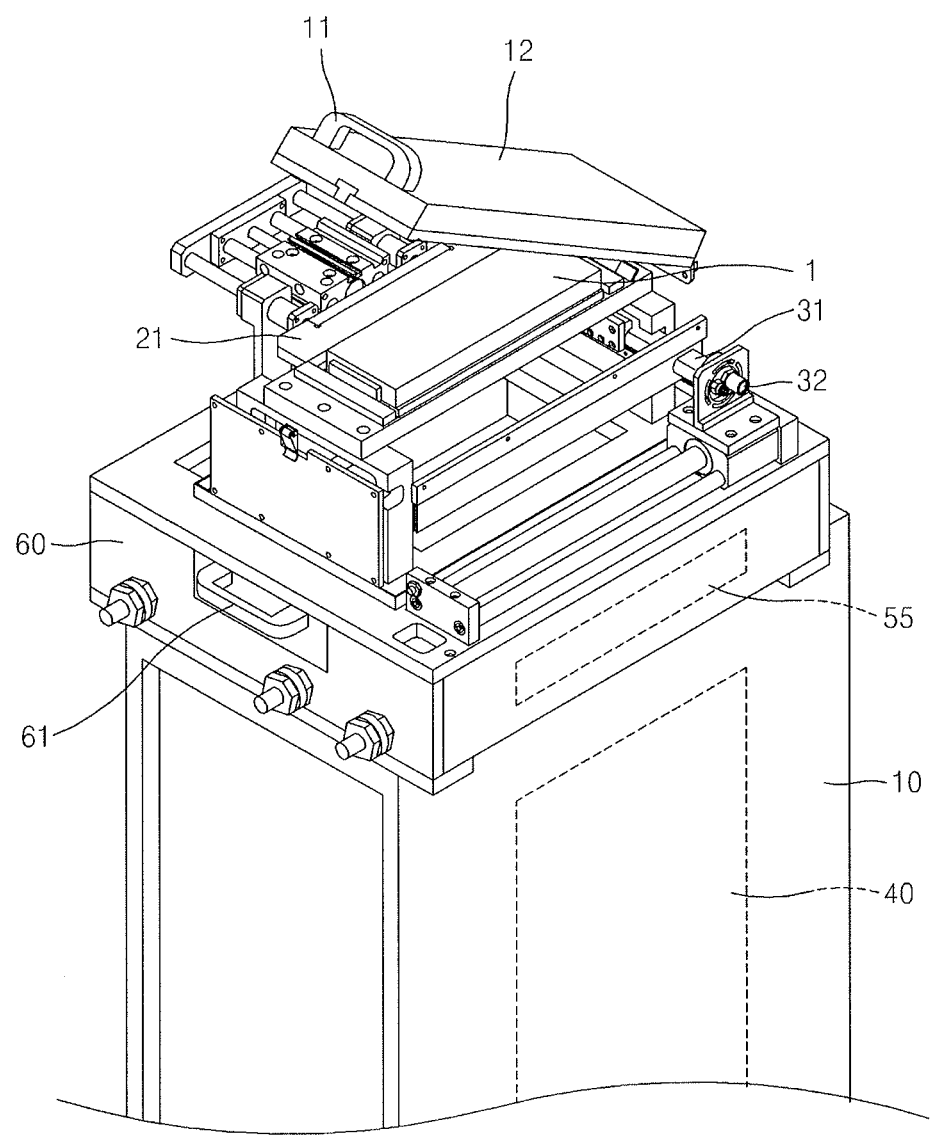
FIG. 5 illustrates a partially exploded perspective view showing an object with flux mounted in the flux cleaning apparatus of FIG. 3.
Figure 6:
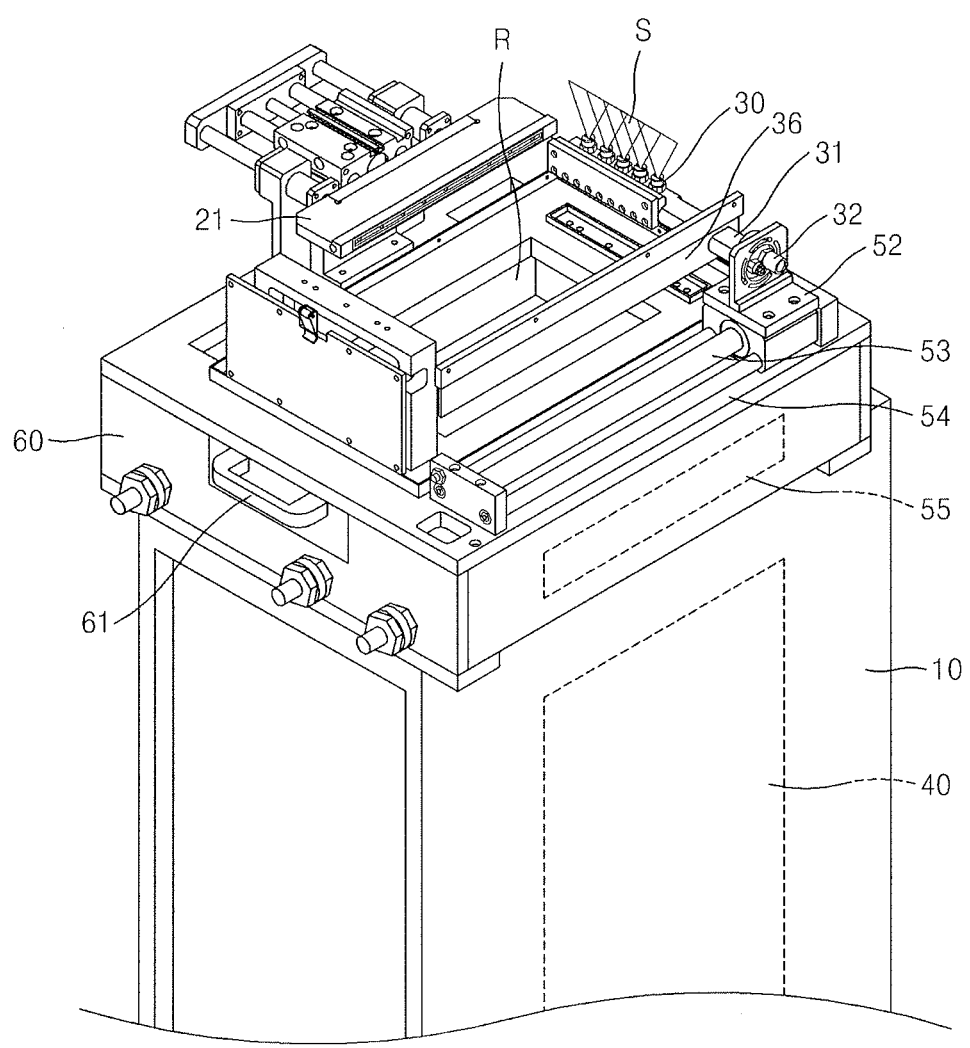
FIG. 6 illustrates a perspective view showing a steam spraying status of a steam spraying nozzle of FIG. 5 in closer detail.
Figure 7:
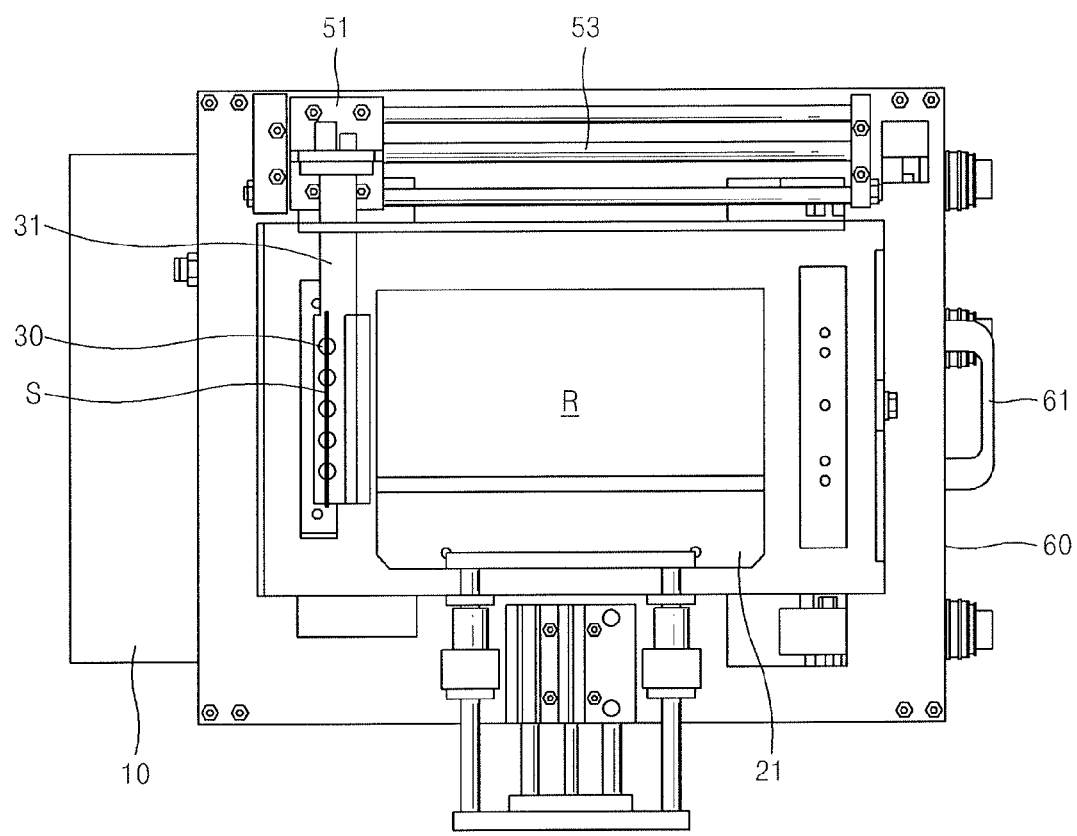
FIG. 7 illustrates a plan view of the structure of the flux cleaning apparatus shown in FIG. 5.
Figure 8:
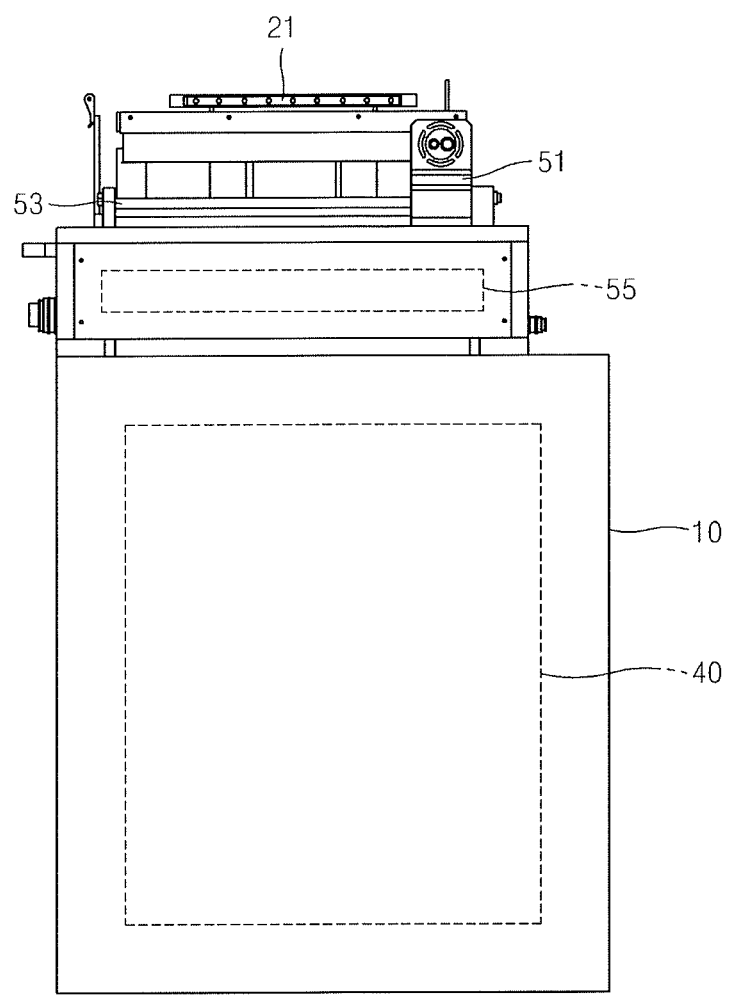
FIG. 8 illustrates a lateral view of the structure of the flux cleaning apparatus shown in FIG. 5.
Figure 9:
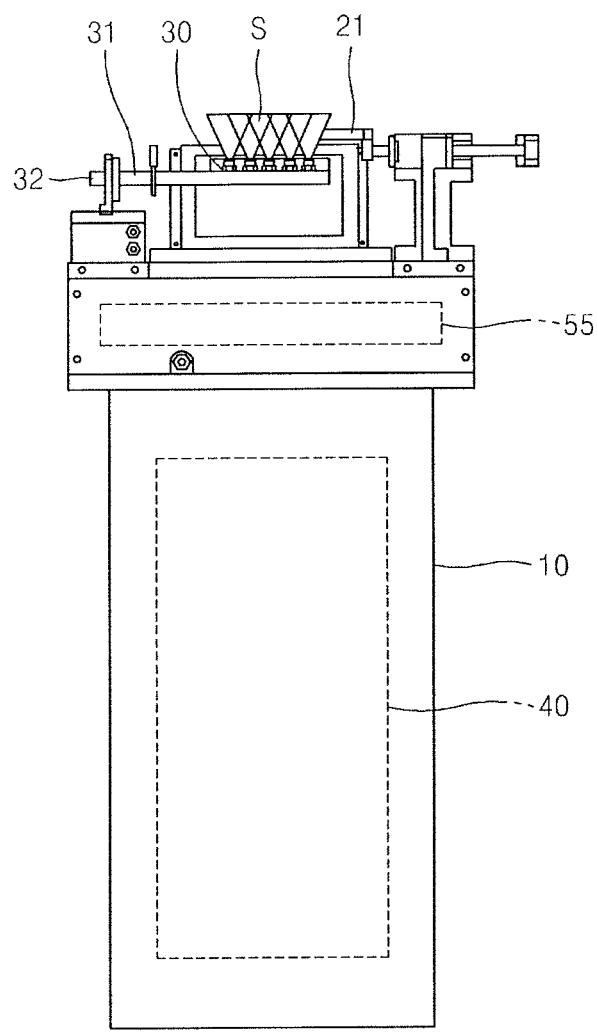
FIG. 9 illustrates a rear view of the structure of the flux cleaning apparatus shown in FIG. 5.

FIG. 3 illustrates a front perspective view of the flux cleaning apparatus according to an exemplary embodiment. FIG. 4 illustrates a rear perspective view of the flux cleaning apparatus of FIG. 3. FIG. 5 illustrates a partially exploded perspective view of the object with flux 1 mounted in the flux cleaning apparatus of FIG. 3. FIG. 6 illustrates a perspective view of a steam spraying status of the steam spraying nozzle 30 of FIG. 5, in closer detail. FIG. 7 illustrates a plan view of the structure of the flux cleaning apparatus illustrated in FIG. 5. FIG. 8 illustrates a lateral view of the structure of the flux cleaning apparatus illustrated in FIG. 5. FIG. 9 illustrates a rear view of the structure of the flux cleaning apparatus illustrated in FIG. 5.

Referring to FIGS. 3 and 4, the cleaning chamber R may be sealed by any of various sealing members to reduce the possibility of and/or to prevent steam from leaking to outside of the cleaning chamber R. For example, a cap 12 having a handle 11 may be installed on top of the cleaning chamber R and/or on top of the body 10 that houses the cleaning chamber R. The cleaning chamber R and/or the body 10 may have an opening that accommodates the cap 12 such that in a closed configuration, e.g., when the cap 12 completely covers the opening such that the cap 12 is disposed within the opening to completely close the opening, the cap 12 may act as a sealing member that seals and/or encloses the cleaning chamber R. In an open configuration, e.g., when the cap 12 is in a non-covering relationship with respect to the opening or covers a partial portion of the opening, an object with flux 1 may be inserted into and/or removed from the cleaning chamber R.

According to an exemplary embodiment, as illustrated in FIGS. 3 and 4, a user may grab the handle 11 and lift up the cap 12 to form the open configuration. After forming the open configuration, the object with flux 1 may be mounted on the mount 20 inside the cleaning chamber R. After mounting the object with flux 1, the cleaning chamber R may be closed by replacing the cap 12, e.g., by forming the closed configuration.

Referring to FIG. 3, a transparent window 13 may be arranged on a sidewall of the cleaning chamber R and/or the body 10 so that, e.g., a user may observe a status of a cleaning operation within the cleaning chamber R through the transparent window 13. The transparent window 13 may be located at a position on the body that corresponds to the placement of the mount 20. A camera (not shown) may be installed, so that a user may observe the cleaning operation via an external device, e.g., a monitor. The user may use the monitor to, e.g., verify an internal status of the cleaning chamber R and the status of a cleaning operation.

The mount 20 may be installed inside the cleaning chamber R in the body 10, e.g., as illustrated in FIGS. 1 and 2. When the flux cleaning apparatus is in an operational mode, e.g., a cleaning operational mode, the object with flux 1, such as a flux tool or an attachment tool used in a separate semiconductor manufacturing process, may be mounted on the mount 20.

The mount 20 may include a clamp 21 to fix the object with flux 1 by holding side surfaces of the object with flux 1. For example, one lateral end of the object with flux 1 may be mounted within the mount 20, e.g., without a clamp 21, and an opposing lateral end of the object with flux 1 may be held by the clamp 21. According to an exemplary embodiment, the object with flux 1 may be mounted on the mount 20 and firmly fixed by the clamp 21, so that the object with flux 1 may be restricted from movement, e.g., will not move, during a cleaning operation. The clamp 21 may be movable, e.g., in a direction toward and away the object with flux 1, such that the clamp 21 may firmly fix the object with flux 1, according to an exemplary embodiment. However, embodiments are not limited thereto, e.g., any of various types of clamps and combinations thereof for holding and fixing the object with flux 1 may be used. The clamp 21 may be installed on two opposite sides of the object with flux 1, or any of various types of clamps for holding and fixing the object with flux 1 may be applied to fix the sides of the object with flux 1.

The steam spraying nozzle 30 may be at least one unit installed inside the cleaning chamber R of the body 10. The steam spraying nozzle 30 may be configured to spray steam S that may have a high temperature and may have a high pressure. The steam S may be quickly evaporated after being sprayed on the object with flux 1, e.g., the steam S may be immediately evaporated after instant cleaning of the object with flux 1. According to an exemplary embodiment, impurities 7, e.g., impurities that include the flux F, on the object with flux 1 may be removed by spraying the steam S. As illustrated in FIG. 1, the impurities 7 may be collected in the cleaning chamber R.

The steam spraying nozzle 30 may be installed on a nozzle rotation shaft 31, e.g., a freely-rotatable nozzle rotation shaft 31. For example, a plurality of steam spraying nozzles 30 may be spaced apart on the nozzle rotation shaft 31, e.g., may be spaced apart by a predetermined distance on a freely-rotatable nozzle rotation shaft 31. The nozzle rotation shaft 31 may be configured so that a spraying angle of the stream spraying nozzle 30 may be adjustable. For example, the nozzle rotation shaft 31 may be capable of rotating at least 180 degrees, such that the steam S may be sprayed from various angles onto the object with flux 1. A rotation knob 32 may be installed on an end of the nozzle rotation shaft 31, e.g., at an end that opposes the end of the nozzle rotation shaft 31 that includes the steam spraying nozzle 30 disposed thereon.

A user may manipulate the nozzle rotation shaft 31 using, e.g., the rotation knob 32. For example, the user may manually adjust an angle, e.g., an angle between ±40° and ±90° with respect to a horizontal direction and/or with respect to the extending direction of the nozzle rotation shaft 31, at which the steam S is sprayed toward the object with flux 1. By adjusting the angle, a cleaning operation may be performed at an optimum angle.

The angle of the nozzle rotation shaft 31 may be adjusted automatically and/or by a control device. For example, the flux cleaning apparatus may include a motor 33 for rotating the nozzle rotation shaft 31. The motor 33 may operate according to a control signal generated from a control unit 34. The control signal may be generated based on a command input via a command input unit 35. The command input unit 35 may be installed on the nozzle rotation shaft 31.

A user may automatically adjust an angle, e.g., an angle between ±40° and ±90° with respect to a horizontal direction, at which the steam S is sprayed toward the object with flux 1 by using the command input unit 35. The user may automatically adjust the angle using, e.g., the command input unit 35, so that a cleaning operation may be performed at an optimum angle. The angle at which the steam S is sprayed may be automatically varied based on a program. The program may be inputted in advance of the cleaning operation, and may be configured for maximizing cleaning efficiency.

The steam supplying unit 40 may be installed on the body 10. For example, the steam supplying unit 40 may be under the cleaning chamber R within the body 10. The steam supplying unit 40 may be connected to the steam spraying nozzle 30. The steam supplying unit 40 may supply steam S to the each of the plurality of steam spraying nozzles 30. The steam S supplied by the steam supplying unit 40 may have both a high temperature and a high pressure.

The steam supplying unit 40 may be any of various types of steam supplying units. For example, the steam supplying unit 40 may be a boiler that converts water to steam having a high temperature and a high pressure by boiling the water.

According to an exemplary embodiment, the steam S supplied by the steam supplying unit 40 may have a high temperature, and the steam S may become the steam S that has a high temperature and a high pressure, as it passes through the steam spraying nozzle 30. The steam S may remove the impurities 7 that include flux F. For example, the steam S having the high temperature and the high pressure may clean the object with flux 1 by quickly and precisely dissolving flux F remaining on the object with flux 1.

Without intending to be bound by this theory, the steam S that has a high temperature and a high pressure, may collide with the flux F on the object with flux 1 at a high speed by way of the steam spraying nozzle 30 directed toward the object with flux 1. The steam S having the high speed may clean the object with flux 1 by melting, e.g., instantly melting, the flux F and separating the flux F from the object with flux 1. The flux F on the object with flux 1 may be melted, e.g., instantly melted, upon being contacted by the steam S. Furthermore, the steam S having a high temperature may evaporate, e.g., evaporate quickly, and thus the object with flux 1 may be quickly dried after being cleaned.

The total cleaning time using a conventional in-water ultrasonic cleaning method, e.g., is about 87 minutes, which includes ultrasonic cleaning time of about 27 minutes, oven drying time using a heating oven of about 40 minutes, and cooling time of about 20 minutes. In contrast, the total cleaning time using a steam cleaning method, according to an exemplary embodiment, may be only about 2 minutes, which includes steam cleaning time of about 1 minute and cooling time of about 1 minute. Therefore, cleaning time may be significantly reduced, according to an exemplary embodiment.

The reciprocator 50 may reciprocate the movable steam spraying nozzle 30. For example, the steam spraying nozzle 30 may move back and forth along a surface of the object with flux 1, and the reciprocator 50 may include a movable base 51, a guidance member 52, an actuator 55, and the control unit 34.

Referring to FIG. 1, the movable base 51 may be a unit to which the nozzle rotation shaft 31, along which the steam spraying nozzles 30 are installed in a row, is installed. The movable base 51 be configured to assist movement of the steam spraying nozzles 30, e.g., the movable base 51 may assist the steam spraying nozzles 30 in freely moving back and forth along a surface of the object with flux 1.

The guidance member 52 may guide a path in which the movable base 51 is transported. The guidance member 52 may include a guidance rod 53, which penetrates the movable base 51. The guidance member 52 may include a guidance rail 54 that guides the bottom surface of the movable base 51. Alternatively, any of various types of guidance members may be applied to form the guidance member 52.

The actuator 55 may be installed on the body 10, e.g., the actuator may be enclosed within the body 10. The actuator 55 may include various cylinders or motors, e.g., a linear motor, for moving the movable base 51 in opposing directions, e.g., for moving the movable base 51 back and forth.

The control unit 34 may apply a control signal to the actuator 55. The control signal may be applied according to a command input by the command input unit 35.

Blocking brushes 36, e.g., as illustrated in FIG. 6, may be installed in a row between the cleaning chamber R and the guidance member 52 to, e.g., reduce the possibility of and/or prevent the steam S from permeating into the movable base 51, the guidance member 52, and the actuator 55. The blocking brushes 36 may extend in a direction parallel to the extending direction of the guidance member 52.

A user may move the steam spraying nozzle 30, e.g., in back and forth directions, along the bottom surface of the object with flux 1 for performing a cleaning operation at an optimal location and/or an optimal speed. The location of the steam spraying nozzle 30 and the speed at which the steam spraying nozzle 30 moves back and forth may be automatically varied based on a program. The program may be inputted in advance in order to maximum cleaning efficiency.

The discharging tray 60 may be installed under the cleaning chamber R of the body 10 to collect the impurities 7 removed from the object with flux 1 by the steam S. The discharging tray 60 may be a drawer-type tray installed below the cleaning chamber R. The discharge tray 60 may be removable from the body 10 for easy discharging of the impurities 7. For example, the discharge tray 60 may have attached thereto a handle 61. The handle 61 may be installed on a lateral side of the discharging tray 60, so that the impurities 7 collected by the discharging tray 60 may be easily discharged. However, embodiments for removing the impurities 7 from the cleaning chamber R are not limited thereto. For example, a drainage hole may be installed in the cleaning chamber R to discharge the impurities 7 out of the cleaning chamber R and the body 10.

According to an exemplary embodiment, the flux cleaning apparatus may be an apparatus for cleaning a flux tool 2 used for a flux dotting process, e.g., as illustrated in FIGS. 1 and 2. Although not shown, the flux cleaning apparatus may also clean any of various tools with impurities 7 that include flux F thereon, such as an attachment tool used for a solder ball attaching operation.

The flux tool 2 may include a body 3. The body 3 may have a flow space formed therein, e.g., the flow space may be a channel. The flux tool 2 may include a back plate 5. The back plate 5 may be housed in the flow space of the body 3. The back plate 5 may be movable within the body 3. The flux tool 2 may include a flux pin 6, e.g., a plurality of flux pins 6 may be mounted on, e.g., directly on, the back plate 5. The flux pin 6 may include a first tip installed on the back plate 5 and a second tip exposed to outside of the body 3 via a pin hole 1a in the body 3, as illustrated in FIG. 2. Each flux pin 6 may extend from inside the body 3 to outside the body 3. The flux tool 2 may include an elastic spring 4. The elastic spring 4 may be installed between the back plate 5 and the body 3, so that a recovery force may be exerted in a direction in which the flux pin 6 moves forward.

When cleaning the flux tool 2, the positive pressure forming unit 80 may form a positive pressure in the flow space in the body 3 of the flux tool 2. The positive pressure forming unit 80 may reduce the possibility of and/or prevent the steam S from permeating into the flow space of the body 3. As such, the positive pressure forming unit 80 may protect the object with flux 1 from the steam S. The positive pressuring forming unit 80 may apply positive pressure directly to flow space of the body 3, as illustrated in FIG. 2.

According to an exemplary embodiment, the positive pressure forming unit 80 may be a positive pressure forming gas supplying pipe 81. The gas supplying pipe 81 may supply a positive pressure forming gas to an inlet 1b formed in the body 3 of the flux tool 2, e.g., as illustrated in FIGS. 1 and 2.

If a positive pressure is formed inside the body 3 of the flux tool 2, e.g., by supplying a positive pressure forming gas such as air or an inert gas via the positive pressure forming gas supplying pipe 81, the positive pressure forming gas may be discharged from the inside of the flux tool 2 to the outside of the flux tool 2. For example, the positive pressure forming gas may be discharged to outside the body 3 via a narrow gap between the flux pin 6 and the pin hole 1a of the body 3. The discharged positive pressure forming gas may push the steam S heading in a direction toward to body 3 back to the cleaning chamber R. As such, the possibility of the steam S entering into the body 3 via the pin hole 1a may be reduced and/or prevented. Therefore, the flux tool 2 may be protected from moisture.

At the same time, the positive pressure forming gas may also dry the flux tool 2 and cool down the flux tool 2, of which a temperature may have risen due to the steam S.

The air curtain forming unit 70 may be installed to form an air curtain between the flux pin 6 and the body 3. The air curtain forming unit 70 may reduce the possibility of and/or prevent the steam S being sprayed toward the flux pin 6 from reaching the body 3 of the object with flux 1. The air curtain forming unit 70 may be installed inside the cleaning chamber R of the body 10. The air curtain forming unit 70 may include an air spraying nozzle 71. The air spraying nozzle 71 may spray air to a space between the flux pin 6 and the body 3.

Referring to FIG. 2, when an air curtain is formed between the flux pin 6 and the body 3 by the air spraying nozzle 71, the steam S in the cleaning chamber R may be protected and/or prevented from flowing toward the body 3. Thus, the flux tool 2 may be protected from moisture. As such, the air curtain forming unit 70 may protect the object with flux 1 from the steam S. The air sprayed from the air spraying nozzle 71 may also dry the flux tool 2 and cool down the flux tool 2, of which the temperature may have risen due to the steam S.

The exhausting unit 90 may be connected to the cleaning chamber R. The exhausting unit 90 may quickly discharge the steam S sprayed by the steam spraying nozzle 30 to outside, e.g., to outside the cleaning chamber R and/or to outside the body 10. As illustrated in FIGS. 1 and 2, the exhausting unit 90 may be an exhausting pipe 91. The exhausting pipe 91 may forcefully discharge the steam S via an exhausting hole 10a formed in a sidewall of the cleaning chamber R and/or in a sidewall of the body 10.

After the steam S sprayed by the steam spraying nozzle 30 finishes cleaning, the steam S may be quickly discharged to outside via the exhausting pipe 91 to protect the flux tool 2 from moisture of the steam S. At the same time, the flux tool 2 may be quickly dried and the flux tool 2 may be cooled, e.g., by the air curtain forming unit 70 and the positive pressure forming unit 80.

The flux cleaning apparatus, e.g., according to the exemplary embodiments discussed above, may clean a flux tool or an attachment tool with flux quickly and precisely and may prevent deformation of a flux tool or an attachment tool due to permeation of moisture, and thus the yield of semiconductor fabrication may be significantly improved.

By way of summation and review, when a wire or a solder ball is bonded in a semiconductor fabrication process, a flux application process for applying flux to a pad of a substrate to improve adhesiveness of the bonding may be used. The flux may be, e.g., a chemical agent that facilitates soldering, removes impurities, and/or prevents oxidation of a base metal. Such a flux application process may include a flux dotting process. The flux dotting process may include applying flux to tips of a plurality of flux pins, e.g., by using a flux tool having the plurality of flux pins. The flux dotting process may also include contacting the flux tool to a substrate, e.g., a pad on the substrate, to place onto the substrate the flux drops on the tips of the flux pins. The flux tool may facilitate dropping the flux on, e.g., directly on, the pad on the substrate.

During the flux dotting process, operations may be successively performed, e.g., on the substrate. An exemplary operation includes an operation of attaching a solder ball by putting the solder ball on the pad of the substrate. The pad of the substrate may have flux thereon, which may adhere the solder ball by a vacuum hole. The flux may have been dotted onto the pad of the substrate by using an attachment tool.

To remove flux remaining on an apparatus, such as a flux tool after the flux dotting process or an attachment tool after the solder ball attaching operation, a cleaning apparatus may be used. For example, the cleaning apparatus may be a cleaning apparatus for washing flux pins by dipping the flux pins into a high-temperature cleaning liquid or a cleaning apparatus for decomposing flux in a cleaning liquid by applying an ultrasonic wave to the cleaning liquid.

However, such a cleaning apparatus, which uses a cleaning liquid, requires a relatively long period of time for decomposing flux in the cleaning liquid and requires relatively long periods of time for drying cleaning liquids remaining on a flux tool or an attachment tool. Further, the cleaning apparatus may require relatively long periods of time for cooling the flux tool or the attachment tool. Therefore, overall cost and time for cleaning the flux are significantly high in such a cleaning apparatus.

Further, due to a capillary phenomenon, a large amount of cleaning liquid may permeate into the flux tool and cause components therein to rust. Thus, locations of flux pins in the flux tool may be altered. Therefore, the flux may not be dotted on the desired locations on the substrate, e.g., the flux may not be dotted onto some of the pads on a substrate or may be dotted to wrong locations on the substrate. As a result, the yield of semiconductor fabrication is significantly deteriorated.

Embodiments, e.g., the exemplary embodiments discussed above, relate to a flux cleaning apparatus and to a flux cleaning apparatus that may cleans a flux tool or an attachment tool having flux thereon by using a property of steam. For example, the flux cleaning apparatus, according to an exemplary embodiment, may use steam that evaporates immediately after instant washing, quickly and precisely, and may reduce the possibility of and/or prevent deformation of a flux tool or an attachment tool due to permeation of moisture. Thus, the yield of semiconductor fabrication may be significantly improved. Further, significant reductions in cleaning time, drying time, and cooling time, may be achieved by using a property of steam.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A method of cleaning an object with flux, the method comprising:
   providing a flux cleaning apparatus that includes a body;
   mounting the object with flux to a mount in the body of the flux cleaning apparatus;
   supplying steam to at least one steam spraying nozzle from a steam supplying unit in the body of the flux cleaning apparatus; and
   spraying steam from the at least one steam spraying nozzle in the body of the flux cleaning apparatus, spraying the steam including adjusting a spraying angle of the steam spraying nozzle at which the steam is sprayed toward the object with flux by rotating the steam spraying nozzle while spraying the steam, the steam being sprayed toward the object with flux on the mount such that the object with flux is cleaned by the steam sprayed from the steam spraying nozzle, the cleaning of the object with flux including removing impurities that include flux from the object with flux.

2. The method as claimed in claim 1, further comprising:
   installing the steam spraying nozzle on a nozzle rotation shaft, and
   rotating the nozzle rotation shaft while spraying the steam to rotate the steam spraying nozzle.

3. The method as claimed in claim 1, wherein adjusting the spraying angle of the steam spraying nozzle includes manually adjusting the spraying angle of the steam spraying nozzle while spraying the steam.

4. The method as claimed in claim 1, wherein adjusting the spraying angle of the steam spraying nozzle includes automatically adjusting the spraying angle of the steam spraying nozzle while spraying the steam.

5. The method as claimed in claim 1, further comprising moving the steam spraying nozzle back and forth relative to a surface of the object with flux.

6. The method as claimed in claim 1, further comprising forming an air curtain to prevent the steam from reaching the body of the flux cleaning apparatus.

7. The method as claimed in claim 1, further comprising forming an air curtain to dry the object with flux or cool down the object with flux.

* * * * *